United States Patent
Hayakawa

(10) Patent No.: US 11,330,749 B2
(45) Date of Patent: May 10, 2022

(54) COMPONENT-MOUNTING DEVICE

(71) Applicant: FUJI CORPORATION, Chiryu (JP)

(72) Inventor: Masashi Hayakawa, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/980,746

(22) PCT Filed: Mar. 23, 2018

(86) PCT No.: PCT/JP2018/011855
§ 371 (c)(1),
(2) Date: Sep. 14, 2020

(87) PCT Pub. No.: WO2019/180954
PCT Pub. Date: Sep. 26, 2019

(65) Prior Publication Data
US 2021/0007255 A1    Jan. 7, 2021

(51) Int. Cl.
*B23P 19/00* (2006.01)
*H05K 13/08* (2006.01)
*H05K 13/04* (2006.01)

(52) U.S. Cl.
CPC ..... *H05K 13/0812* (2018.08); *H05K 13/0409* (2018.08); *H05K 13/0815* (2018.08); *Y10T 29/53174* (2015.01)

(58) Field of Classification Search
CPC ............. H01L 21/681; H01L 2224/951; H01L 2224/95121; H01L 22/20; H01L 22/26;
(Continued)

(56) References Cited

U.S. PATENT DOCUMENTS 10,966,358 B2 * 3/2021 Oyama ................ H05K 13/083
10,966,361 B2 * 3/2021 Sakurayama ...... H05K 13/0815
(Continued)

FOREIGN PATENT DOCUMENTS

JP    2015-159285 A    9/2015

OTHER PUBLICATIONS

International Search Report dated May 15, 2018 in PCT/JP2018/011855 filed on Mar. 23, 2018, 2 pages.

*Primary Examiner* — Thiem D Phan
(74) *Attorney, Agent, or Firm* — Oblon, McClelland, Maier & Neustadt, L.L.P.

(57) ABSTRACT

A component mounting device configured to mount a component, which has a feature portion on an upper surface, on a board. The component mounting device picks up the component, images a lower surface of the picked-up component, temporarily loads the picked-up component on a target temporary loading position to a temporary loading stand which is corrected based on a pickup deviation amount of the component to be recognized based on a lower surface image of the imaged component. Subsequently, the component mounting device images an upper surface of the temporarily loaded component, picks up again the component which is temporarily loaded on the temporary loading stand, and images a lower surface of the re-picked up component. Then, the component mounting device mounts the re-picked up component on a target mounting position of the board corrected based on a positional deviation amount of the feature portion.

7 Claims, 8 Drawing Sheets

(58) Field of Classification Search
CPC ............... G01R 31/01; H05K 13/0413; H05K 13/0813; H05K 3/32; H05K 13/0812; H05K 13/0815; Y10T 29/49004; Y10T 29/53174; Y10T 156/17
USPC ......... 29/739, 720, 729, 740, 741, 743, 829, 29/832, 833
See application file for complete search history.

(56) References Cited

U.S. PATENT DOCUMENTS

2015/0237309 A1     8/2015    Heilmann
2019/0133010 A1     5/2019    Sakurayama et al.

* cited by examiner

COMPONENT-MOUNTING DEVICE

TECHNICAL FIELD

The present specification discloses a component mounting device.

BACKGROUND ART

Conventionally, in a component mounting device configured to mount a component on a board, a component mounting device including a measurement station having a first camera attached to a head to image the component from above and a second camera imaging a transparent plate and the component loaded on an upper surface thereof from below has been proposed (for example, see Patent Literature 1). The component mounting device loads the component on the upper surface of the transparent plate, images the upper surface of the loaded component by the first camera and, simultaneously, images a lower surface of the component by the second camera. Next, the component mounting device recognizes a spatial deviation between a structural feature (first structural feature) of the upper surface of the component and a structural feature (second structural feature) of the lower surface of the component based on two images imaged by the both cameras. Then, the component mounting device aligns a center of the first structural feature of the component to a component carrier (printed board) and attaches the component to the component carrier.

PATENT LITERATURE

Patent Literature 1: JP-A-2015-159285

BRIEF SUMMARY

Technical Problem

However, if a positional deviation occurs when picking up the component, the component mounting device described above mounts the component on the board while the positional deviation occurs thereby deteriorating mounting accuracy.

A main purpose of the present disclosure is to further improve mounting accuracy when a component is mounted on a board.

Solution to Problem

The present disclosure has taken the following means to achieve the main object described above.

A component mounting device of the present disclosure is a component mounting device configured to mount a component, which has a feature portion on an upper surface, on a board, the component mounting device including: a head having a pickup member which picks up the component; a relative moving device configured to relatively move the head; an upper imaging device imaging the component from above; a lower imaging device imaging the component from below; a temporary loading stand configured to temporarily load the component; and a control device configured to control the head and the relative moving device in such a way that a component supplied from a component supplying device is picked up, control the lower imaging device in such a way that a lower surface of the picked-up component is imaged, correct a target temporary loading position to the temporary loading stand based on a pickup deviation amount of the component that is recognized based on a lower surface image of the imaged component, control the head and the relative moving device in such a way that the picked-up component is temporarily loaded on the corrected target temporary loading position, control the upper imaging device in such a way that an upper surface of the temporarily loaded component is imaged, control the head and the relative moving device in such a way that the temporarily loaded component on the temporary loading stand is picked up again, control the lower imaging device in such a way that the lower surface of the re-picked up component is imaged, correct a target mounting position to the board based on a positional deviation amount of the feature portion recognized based on an upper surface image of the imaged component after being temporarily loaded, and a re-picked up deviation amount of the component that is recognized based on a lower surface image of the imaged component after being re-picked up, and control the head and the relative moving device in such a way that the re-picked up component is mounted at the corrected target mounting position.

The component mounting device of the present disclosure images the lower surface of the picked-up component, temporarily loads the component on the target temporary loading position of the temporary loading stand, of which the pickup deviation recognized by the lower surface image is corrected, and images the upper surface of the component which is temporarily loaded. Then, the component mounting device images the lower surface of the re-picked up component from the temporary loading stand and mounts the component on the target mounting position of the board in which the positional deviation of the feature portion recognized by the upper surface image and the re-pickup deviation recognized by the lower surface image are corrected. Thus, even if the pickup deviation of the component occurs, the component mounting device can temporarily load the component more accurately on the target position of the temporary loading stand. Therefore, the component mounting device can recognize the positional deviation of the feature portion more accurately by the upper surface image obtained by imaging the upper surface of the temporarily loaded component, and reflect the target mounting position to the board. In addition, since the component mounting device reflects the re-pickup deviation recognized by the lower surface image of the re-picked up component from the temporary loading stand to the target mounting position to the board, even if the re-pickup deviation of the component occurs, the component mounting device can mount the component more accurately on the target position of the board. As a result, the mounting accuracy can be further improved.

DESCRIPTION OF EMBODIMENTS

Figure 1:
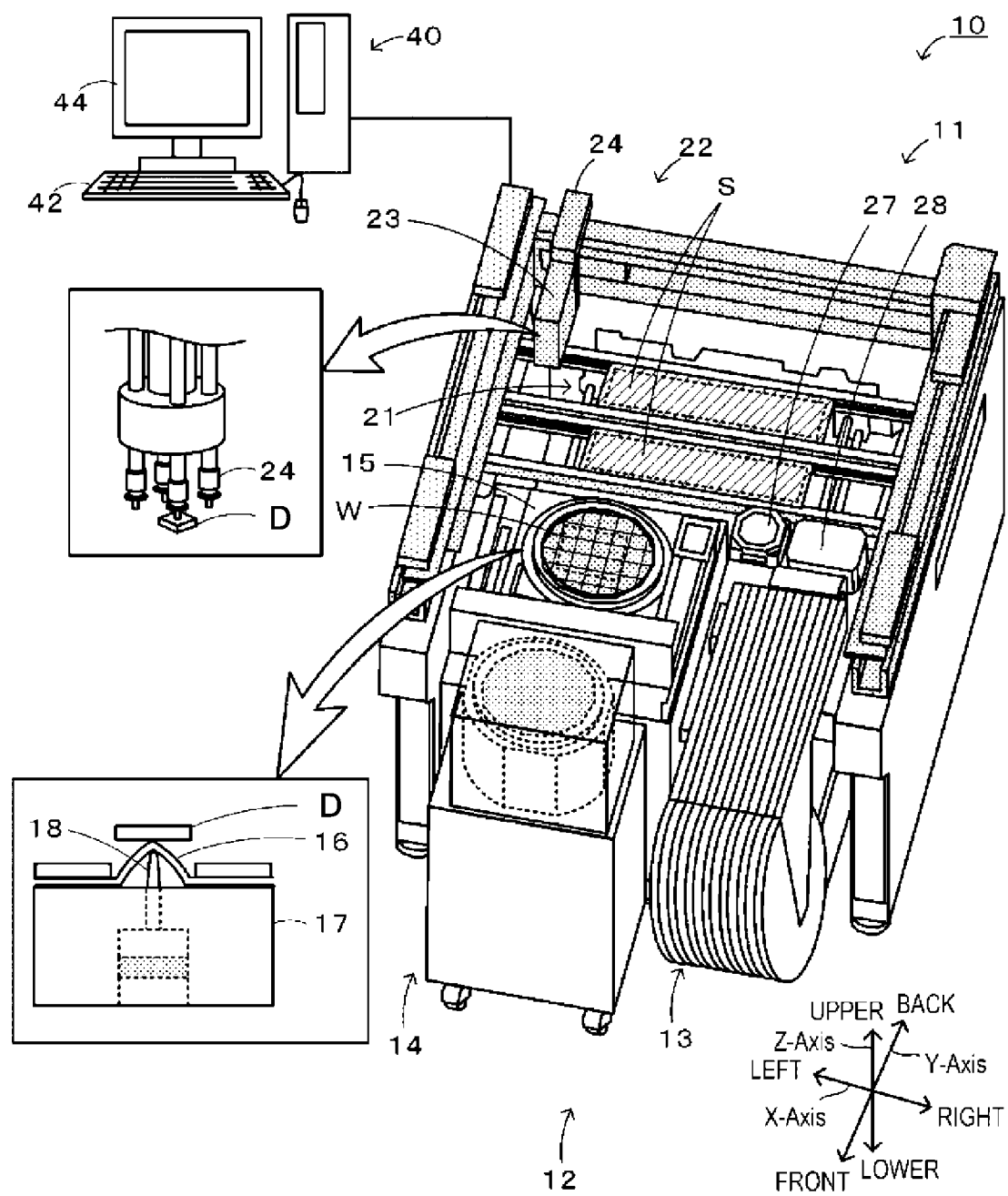
FIG. 1 is an explanatory view illustrating an example of component mounting system 10.
Figure 2:
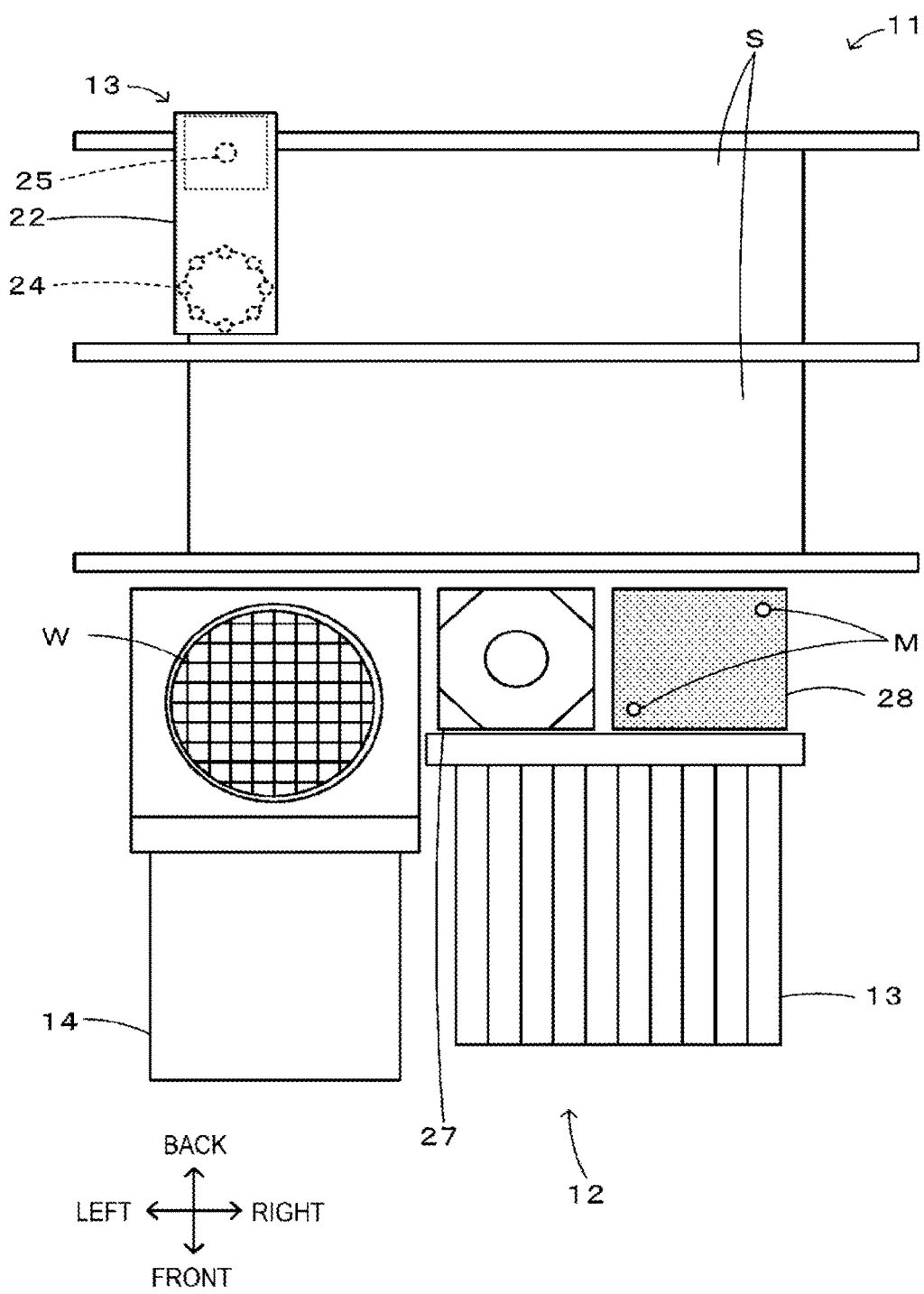
FIG. 2 is a configuration view illustrating an outline of a configuration of component mounting device 11.
Figure 3:
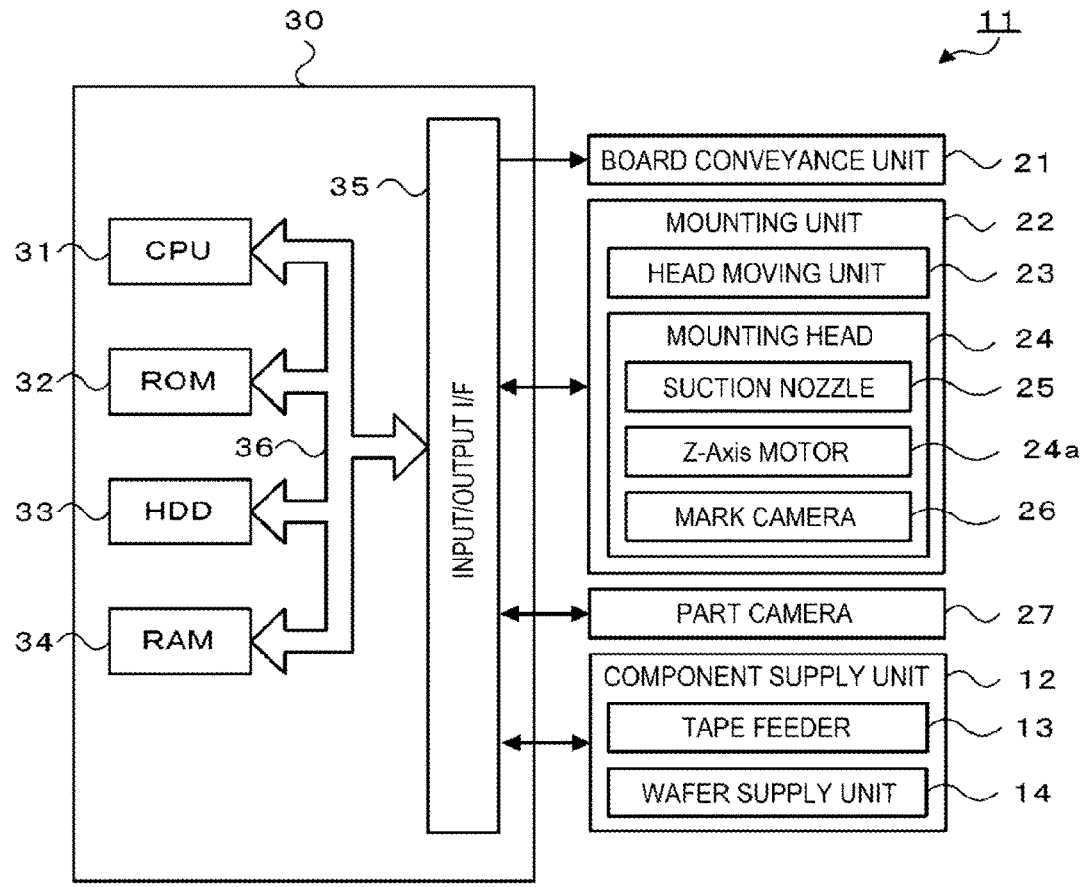
FIG. 3 is a block diagram illustrating an electrical connection relationship of component mounting device 11.
Figure 4:
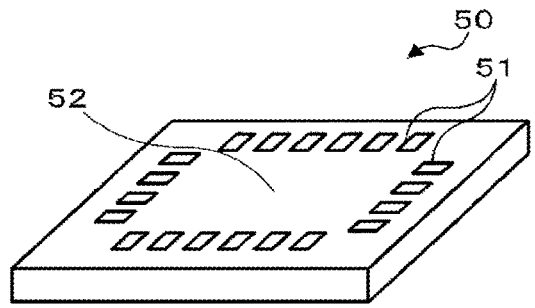
FIG. 4 is an external view of specific component 50.

FIG. 1 is an explanatory view illustrating an example of component mounting system 10. FIG. 2 is a configuration view illustrating an outline of a configuration of component mounting device 11. FIG. 3 is a block diagram illustrating an electrical connection relationship of component mounting device 11. FIG. 4 is an external view of specific component 50. Component mounting system 10 is a system that executes a mounting process related to a process of mounting a component on board S. Component mounting system 10 includes component mounting device 11 and management computer 40. In component mounting system 10, multiple component mounting devices 11, which each executes a mounting process (installing process) for mounting (installing) components on board S, are disposed from upstream to downstream. In FIG. 1, only one component mounting device 11 is illustrated. Incidentally, in FIG. 1, a lateral direction is an X-axis direction, a longitudinal direction is a Y-axis direction, and a vertical direction is a Z-axis direction.

As illustrated in FIGS. 1 to 3, component mounting device 11 includes component supply unit 12, board conveyance unit 21, mounting unit 22, part camera 27, loading stand 28, and control device 30. Component mounting device 11 can mount not only a general-purpose component of which a shape or the like can be obtained by being imaged from a lower surface side but also, as illustrated in FIG. 4, specific component 50 having feature portion 51 on an upper surface side thereof. Specific component 50 has feature portion 51 of which a position, a shape, or the like is required to be recognized from the upper surface side, and abutting surface 52 which is an upper surface abutting at a time of picking up. feature portion 51 may be, for example, a terminal, a light emitting body (LED component having an upper portion formed of a transparent resin having light transmittance), or the like.

Component supply unit 12 includes tape feeder 13 and wafer supply unit 14. Tape feeder 13 has a reel on which a tape is wound. Multiple components are held on the tape at equal intervals along a longitudinal direction of the tape. Tape feeder 13 unwinds the tape from the reel and delivers the tape to a suction position where the component is picked up by suction by suction nozzle 25 in a state where the component is exposed. Wafer supply unit 14 delivers die D obtained by dividing wafer W to a suction position where die D is picked up by suction by suction nozzle 25, and includes wafer pallet 15, pot 17, and push-up pin 18. Wafer pallet 15 is configured to fix sheet 16 to which wafer W is adhered in a state of being stretched. Pot 17 is disposed below wafer pallet 15 and is configured to be movable in an XY direction by a moving device (not illustrated). Push-up pin 18 pushes up die D picked up by suction by suction nozzle 25 among divided dies D of wafer W adhered to sheet 16, from a back side of sheet 16. Push-up pin 18 is disposed inside pot 17 and is configured to be movable in a Z direction by a lifting device (not illustrated). Die D is peeled off from sheet 16 by being pushed up from the back side of sheet 16 by push-up pin 18. Specific component 50 (component with a terminal or LED component) described above may be supplied by a tape feeder 13 or may be supplied by wafer supply unit 14.

Board conveyance unit 21 is a unit for performing carrying-in, conveying, fixing at a mounting position, and carrying-out of board S. Board conveyance unit 21 has a pair of conveyor belts which are provided at intervals in the longitudinal direction of FIG. 1 and stretched in the lateral direction. Board S is conveyed by the conveyor belts.

Mounting unit 22 is configured to pick up the component from component supply unit 12 (tape feeder 13 and wafer supply unit 14) and mount the component on board S fixed to board conveyance unit 21. Mounting unit 22 includes head moving unit 23, mounting head 24, and suction nozzle 25. Head moving unit 23 includes a slider which is guided by a guide rail to move in the XY direction, and a motor for driving the slider. Mounting head 24 is detachably mounted on the slider, and is moved in the XY direction by head moving unit 23. One or more suction nozzles 25 are detachably mounted on a lower surface of mounting head 24. Suction nozzle 25 is a pickup member for picking up the component by utilizing a pressure (negative pressure). Mounting head 24 incorporates Z-axis motor 24a and adjusts a height of suction nozzle 25 along the Z-axis by Z-axis motor 24a. Further, mounting head 24 includes a rotation device (not illustrated) for rotating (turning) suction nozzle 25 by a drive motor, and is capable of adjusting a mounting angle of the components picked up by suction by suction nozzle 25. Mounting head 24 has a structure (rotary head) in which a cylindrical holding member for holding multiple (for example, 8, 12, or the like) suction nozzles 25 rotates, and suction nozzle 25 of a predetermined position (here, foremost the device) is movable downward.

Mark camera 26 is disposed in mounting head 24. Mark camera 26 is, for example, a device capable of imaging board S and the component from above. Mark camera 26 is disposed on the lower surface side of mounting head 24 (or slider), and moves in the XY direction together with mounting head 24. Mark camera 26 has a lower side which is an imaging region, images a reference mark used for obtaining a position of board S, which is attached to board S, and outputs the image to control device 30. Further, mark camera 26 images reference mark M attached to loading stand 28 and used for obtaining a positional deviation and deformation of loading stand 28, and outputs the image to control device 30. Furthermore, mark camera 26 images the upper surface (feature portion 51) of specific component 50, and outputs the image to control device 30.

part camera 27 is disposed between board conveyance unit 21 and component supply unit 12. An imaging range of part camera 27 is above part camera 27. When suction nozzle 25, which picks up the component by suction, passes above part camera 27, part camera 27 images the component picked up by suction by suction nozzle 25 from below, and outputs the image to control device 30.

Loading stand 28 is disposed between board conveyance unit 21 and component supply unit 12, and next to part camera 27. Loading stand 28 is supported in such a way that the upper surface, on which the component is loaded, is horizontal, and is used as a temporary loading stand of specific component 50. When specific component 50 is loaded on loading stand 28, a posture thereof is more likely to be stable than that when it is loaded on wafer pallet 15. Loading stand 28 may be formed to be sized to load the maximum number of specific components 50 to be picked up by suction, on mounting head 24 at a time. Reference mark M described above is attached to the upper surface of loading stand 28.

As illustrated in FIG. 3, control device 30 is configured as a micro-processor centered on CPU 31. In addition to CPU 31, control device 30 includes ROM 32 for storing a processing program, HDD 33 for storing various data, RAM 34 used as a work area, and input/output interface 35 for exchanging an electrical signal with an external device. These are connected via bus 36. Control device 30 outputs control signals to board conveyance unit 21, mounting unit 22 (Z-axis motor 24a and mark camera 26), component supply unit 12, and part camera 27. Further, control device 30 inputs signals from mounting unit 22 (mark camera 26), component supply unit 12, and part camera 27.

Management computer (PC) 40 is a computer that manages information of each device of component mounting system 10. Management PC 40 includes a control device configured as a CPU-centered microprocessor. The control device includes a ROM for storing a processing program, an HDD for storing various data, a RAM used as a work area, an input/output interface for exchanging an electrical signal with an external device, and the like. Management PC 40 includes input device 42 such as a keyboard or a mouse for an operator to input various commands, and display 44 for displaying various pieces of information. The HDD stores job information including a production program and other production information. Here, in component mounting device 11, the production program is a program determining which component is mounted on which board S in which order, and how many boards mounted in that way are produced. Further, the production information includes component information (type, size, or the like of the component) relating to the component of a mounting target, target mounting position (X*, Y*), and the like. Management PC 40 is communicably connected to control device 30 of component mounting device 11 and performs exchange of various pieces of information and control signals.

Figure 5:
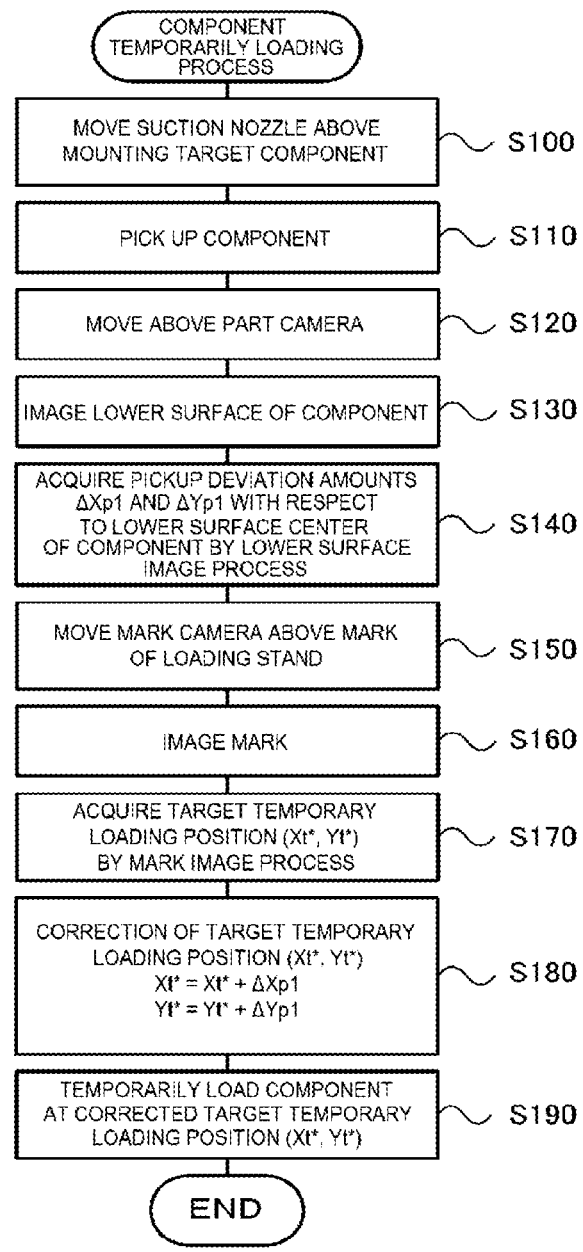
FIG. 5 is a flowchart illustrating an example of a component temporary loading process.

The following description is a description of an operation of component mounting system 10 configured in this way, in particular a temporary loading operation in which specific component 50 is picked up from component supply unit 12 and is temporarily loaded on loading stand 28, and a mounting operation in which an upper surface side of specific component 50 temporarily loaded on loading stand 28 is recognized and specific component 50, which is picked up again, is mounted on board S. FIG. 5 is a flowchart illustrating an example of the component temporary loading process. This process is executed by control device 30 when job information is received from management PC 40 and board S is carried in and fixed by board conveyance unit 21.

Figure 6:
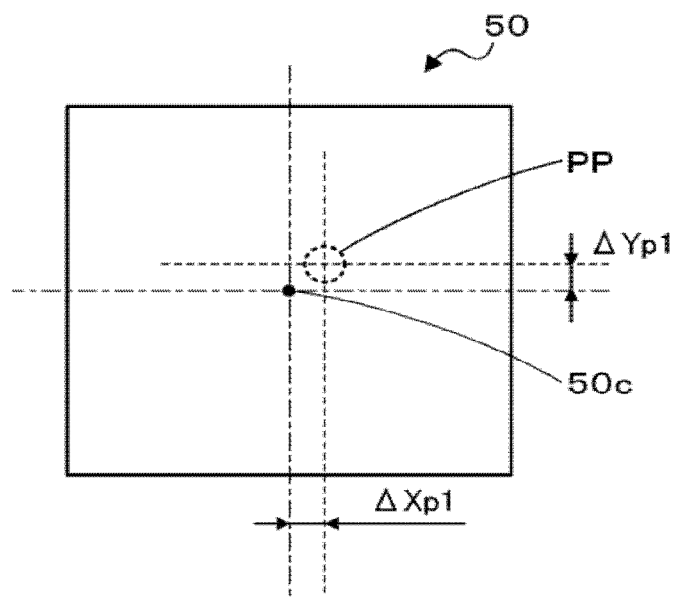
FIG. 6 is an explanatory view illustrating a state where a pickup deviation amount is acquired.

In the component temporary loading process, CPU 31 of control device 30 first controls head moving unit 23 so that suction nozzle 25 comes above specific component 50 of the mounting target (S100). Subsequently, CPU 31 controls Z-axis motor 24a so that suction nozzle 25 descends to pick up (suck) specific component 50 (S110). Then, CPU 31 controls head moving unit 23 so that specific component 50 picked up by suction nozzle 25 comes above part camera 27 (S120). Next, CPU 31 controls part camera 27 so that the lower surface of specific component 50 (S130) is imaged and processes the lower surface image of imaged specific component 50 to acquire pickup deviation amounts $\Delta Xp1$ and $\Delta Yp1$ which are the positional deviation amounts in the XY direction of pickup position PP of suction nozzle 25 with respect to an outer shape center (lower surface center) of specific component 50 (S140). FIG. 6 is an explanatory view illustrating a state where a pickup deviation amount is acquired. As illustrated in the drawing, acquisition of pickup deviation amounts $\Delta Xp1$ and $\Delta Yp1$ is performed by acquiring a difference (deviation amount) between lower surface center 50c of specific component 50 and pickup position PP in the X direction and the Y direction, respectively.

When pickup deviation amounts $\Delta Xp1$ and $\Delta Yp1$ are acquired, CPU 31 controls head moving unit 23 so that mark camera 26 comes above reference mark M of loading stand 28 (S150). Subsequently, mark camera 26 is controlled so as to image reference mark M (S160), and the mark image of imaged reference mark M is processed to acquire target temporary loading position (Xt*, Yt*) of loading stand 28 which is determined by reference mark M (S170). Next, CPU 31 corrects acquired target temporary loading position (Xt*, Yt*) to a position offset in a direction in which the pickup deviation is canceled by pickup deviation amounts $\Delta Xp1$ and $\Delta Yp1$ in the XY direction acquired in S140 (S180). Then, CPU 31 controls head moving unit 23 and mounting head 24 so that specific component 50 is temporarily loaded on corrected target temporary loading position (Xt*, Yt*) (S190), and terminates the component temporary loading process.

Figure 7:
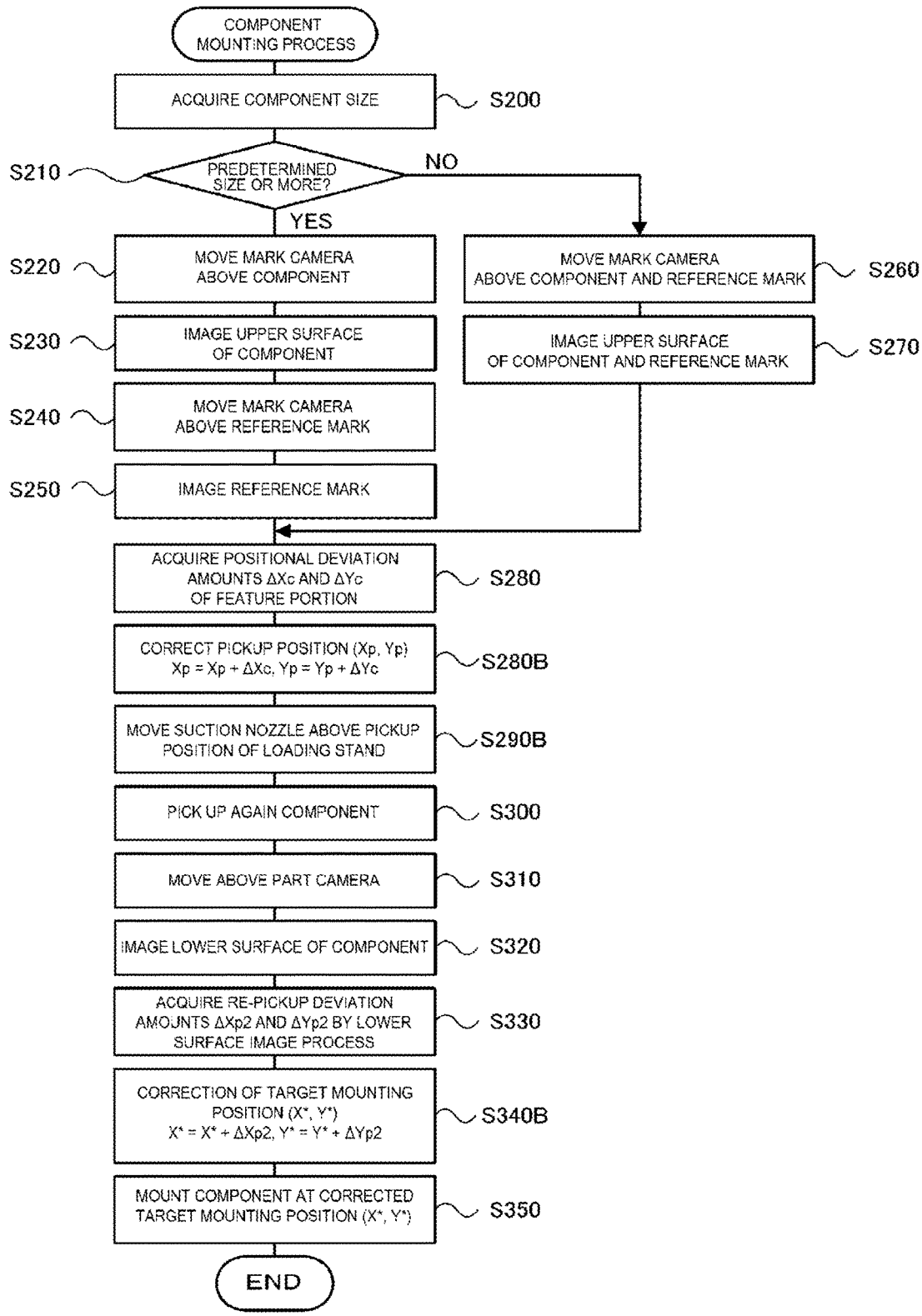
FIG. 7 is a flowchart illustrating an example of a component mounting process.

FIG. 7 is a flowchart illustrating an example of a component mounting process. This process is executed by control device 30 after the component temporary loading process is executed.

In the component mounting process, CPU 31 of control device 30 first acquires a component size from the component information included in the received job information (S200), and determines whether the component size is a predetermined size or more (S210). Here, the predetermined size is a threshold value for determining whether specific component 50 and reference mark M temporarily loaded on loading stand 28 can be included within the imaging range of mark camera 26. The predetermined size is determined in advance based on the imaging range, the position of reference mark M, and the like. When it is determined that the component size is the predetermined size or more, CPU 31 controls head moving unit 23 so that mark camera 26 comes above specific component 50 on loading stand 28 (S220), and controls mark camera 26 so that the upper surface side of specific component 50 is imaged (S230). Then, CPU 31 controls head moving unit 23 so that mark camera 26 comes above reference mark M (S240), and controls mark camera 26 so that reference mark M is imaged (S250). That is, CPU 31 separately images specific component 50 and reference mark M on loading stand 28. On the other hand, when it is determined that the component size is less than the predetermined size, CPU 31 controls head moving unit 23 so that the imaging range of mark camera 26 is included in both specific component 50 and reference mark M (S260), and controls mark camera 26 so that the upper surface side of specific component 50 and reference mark M are imaged (S270). That is, CPU 31 simultaneously images specific component 50 and reference mark M on loading stand 28. In a case where multiple reference marks M are provided on loading stand 28, CPU 31 may simultaneously image a part of multiple reference marks M and specific component 50, and then may move mark camera 26 by head moving unit 23 to image remaining reference marks M.

Figure 8:
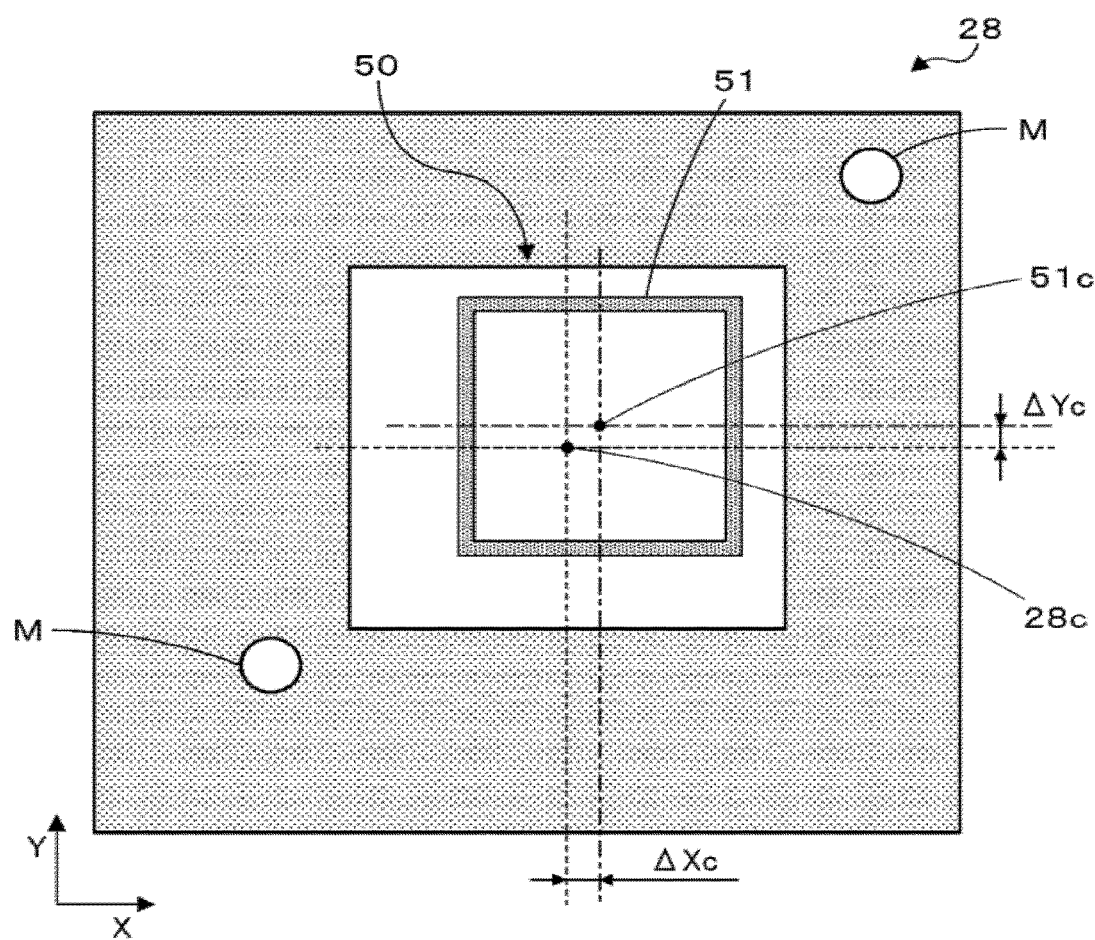
FIG. 8 is an explanatory view illustrating a state where a positional deviation amount of feature portion 51 is acquired.

Next, CPU 31 processes the mark image of the upper surface image of specific component 50 and reference mark M, which are imaged, to acquire positional deviation amounts $\Delta Xc$ and $\Delta Yc$ of feature portion 51 provided on the upper surface of specific component 50 in the XY direction (S280). FIG. 8 is an explanatory view illustrating a state where the positional deviation amount of feature portion 51 is acquired. As illustrated in the drawing, the acquisition of positional deviation amounts $\Delta Xc$ and $\Delta Yc$ of feature portion 51 is performed by acquiring the difference between target temporary loading center 28c and center 51c of feature portion 51 which are determined by reference mark M in each of the X direction and the Y direction. Here, in specific component 50 having feature portion 51 on the upper surface, due to a manufacturing variation, center 51c of feature portion 51 may be deviated with respect to an outer shape center (lower surface center) of the component. Therefore, by acquiring the positional deviation amount between center 51c of feature portion 51 and target temporary loading center 28C, CPU 31 can reflect the positional deviation of feature portion 51 when specific component 50 is mounted on board S.

When positional deviation amounts ΔXc and ΔYc of feature portion 51 are acquired, CPU 31 controls head moving unit 23 so that suction nozzle 25 comes above specific component 50 temporarily loaded on loading stand 28 (S290). Subsequently, CPU 31 controls Z-axis motor 24a so that suction nozzle 25 descends to pick up again (suck again) specific component 50 (S300). Next, CPU 31 controls head moving unit 23 so that specific component 50, which is picked up again by suction nozzle 25, comes above part camera 27 (S310). Then, CPU 31 controls part camera 27 so that the lower surface of specific component 50 is imaged (S320), and processes the lower surface image of specific component 50, which is imaged, to acquire re-pickup deviation amounts ΔXp2 and ΔYp2 in the XY direction, which are the positional deviation amounts of pickup position PP of the suction nozzle 24 with respect to the lower surface center of specific component 50 (S330). The acquisition of re-pickup deviation amounts ΔXp2 and ΔYp2 is performed by the same process as that of pickup deviation amounts ΔXp1 and ΔYp1 described above.

When re-pickup deviation amounts ΔXp2 and ΔYp2 are acquired, CPU 31 corrects target mounting position (X*, Y*) to board S, which is included in the component information received from management PC 40 (S340). CPU 31 offsets target mounting position (X*, Y*) in a direction in which the positional deviation is canceled by positional deviation amounts ΔXc and ΔYc of the feature portion 51 acquired in S280 and corrects target mounting position (X*, Y*) to a offset position in a direction in which the pickup deviation is canceled by re-pickup deviation amounts ΔXp2 and ΔYp2 acquired in S330. Then, CPU 31 controls head moving unit 23 and mounting head 24 so that specific component 50 is mounted at corrected target mounting position (X*, Y*) (S350), and ends the component mounting process. Thus, specific component 50 is mounted on board S so that center 51c of feature portion 51 matches target mounting position (X*, Y*) before offset.

Here, a correspondence relationship between the configuration elements of the present embodiment and the configuration elements of the present disclosure will be clarified. Mounting head 24 of the present embodiment corresponds to the head of the present disclosure, head moving unit 23 corresponds to the relative moving device, mark camera 26 corresponds to the upper imaging device, and part camera 27 corresponds to the lower imaging device. Further, loading stand 28 corresponds to the temporary loading stand and control device 30 for executing the component temporary loading process of FIG. 5 and the component mounting process of FIG. 7 corresponds to the control device. In addition, reference mark M corresponds to the mark.

Component mounting device 11 described above images the lower surface of specific component 50 which is picked up, and temporarily loads specific component 50 on target temporary loading position (Xt*, Yt*) of loading stand 28 corrected based on pickup deviation amounts ΔXp1 and ΔYp1 which are acquired by the lower surface image. Subsequently, component mounting device 11 images the upper surface of temporarily loaded specific component 50, and picks up again specific component 50 from loading stand 28. Next, component mounting device 11 images the lower surface of specific component 50 which is picked up again, and mounts re-picked up specific component 50 on target mounting position (X*, Y*) to board S, which is corrected, based on positional deviation amounts ΔXc and ΔYc of feature portion 51 acquired by the upper surface image, and re-pickup deviation amounts ΔXp2 and ΔYp2 acquired by the lower surface image. Thus, even if the pickup deviation occurs when specific component 50 is picked up, component mounting device 11 can temporarily load the component more accurately on the target position of loading stand 28. Therefore, component mounting device 11 recognizes the positional deviation of temporarily loaded feature portion 51 more accurately by the upper surface image obtained by imaging the upper surface of specific component 50, and can reflect the target mounting position to board S. In addition, component mounting device 11 reflects re-pickup deviations of ΔXp2 and ΔYp2, which are recognized by the lower surface image, to the target mounting position to board S, therefore, even if the pickup deviation occurs when specific component 50 is picked up again, component mounting device 11 can mount specific component 50 on the target position of board S more accurately. As a result, the mounting accuracy can be further improved.

In addition, loading stand 28 has reference mark M to be imaged by mark camera 26. Component mounting device 11 corrects target temporary loading position (Xt*, Yt*), which is determined based on the mark image obtained by imaging reference mark M, based on pickup deviation amounts ΔXp1 and ΔYp1. Further, component mounting device 11 acquires positional deviation amounts ΔXc and ΔYc of feature portion 51 based on the upper surface image obtained by imaging the upper surface of specific component 50 temporarily loaded on loading stand 28 and the mark image obtained by imaging reference mark M. Then, the component mounting device 50 corrects target mounting position (X*, Y*) to board S based on positional deviation amounts ΔXc and ΔYc of feature portion 51, and re-pickup deviation amounts ΔXp2 and ΔYp2. Thus, even if deformation occurs in loading stand 28 due to heat or the like caused by the operation of component mounting device 11, it is possible to obtain positional deviation amounts ΔXc and ΔYc of feature portion 51 more accurately.

Furthermore, component mounting device 11 separately images the upper surface of specific component 50 and reference mark M temporarily loaded on loading stand 28 when the component size is a predetermined size or more, and simultaneously images the upper surface of specific component 50 and reference mark M temporarily loaded on loading stand 28 when the component size is less than the predetermined size. Thus, when the component size is small, it is possible to shorten the time required for acquiring positional deviation amounts ΔXc and ΔYc of feature portion 51.

Further, loading stand 28 is installed at a different location from part camera 27. For example, in a case where a transparent plate is installed above part camera 27 and the transparent plate is used as a temporary loading stand, if the transparent plate is scratched by temporary loading, the transparent plate may adversely affect the process of an image imaged by part camera 27. However, in the present embodiment, since loading stand 28 is not above part camera 27, the inconvenience described above does not occur.

It is needless to say that the present disclosure is not limited to the embodiments described above, and may be implemented in various aspects as long as they belongs to the technical scope of the present disclosure.

For example, in the embodiments described above, imaging of reference mark M of loading stand 28 is supposed to be done at a timing before temporarily loading picked-up specific component 50 on loading stand 28 and at a timing after being temporarily loaded on loading stand 28. However, imaging of reference mark M of loading stand 28 may be performed only at any one of the timings described above. Incidentally, in a case where the reference mark is imaged only at the former timing, CPU 31 can use target temporary loading position (Xt*, Yt*) acquired in S170 of the component temporary loading process of FIG. 5, for acquiring positional deviation amounts ΔXc and ΔYc of feature portion 51 in S280 of the component mounting process of FIG. 7. In addition, in a case where reference mark M is imaged only at the latter timing, CPU 31 can use target temporary loading position (Xt*, Yt*) of loading stand 28 determined based on the mark image as target temporary loading position (Xt*, Yt*) to be acquired in S170 at the time of temporary loading of a next specific component.

In the embodiments described above, loading stand 28 has reference mark M, but the present disclosure is not limited thereto, and may not have reference mark M. In this case, in the component temporary loading process of FIG. 5, CPU 31 may omit the process of S150 and S160 and acquire the target temporary loading position (target temporary loading center) of loading stand 28 determined in advance in S170. Further, in the component mounting process of FIG. 7, CPU 31 may execute a process of imaging the upper surface of specific component 50 by the mark camera 27 in place of S210, and execute a process of acquiring positional deviation amounts ΔXc and ΔYc of feature portion 51 based on the upper surface image of specific component 50 in place of S220. The acquisition of positional deviation amounts ΔXc and ΔYc is performed by acquiring the difference between the target temporary loading center of loading stand 28, which is described above and determined in advance, and center 51c of feature portion 51 of specific component 50 in the X direction and the Y direction, respectively.

Furthermore, in the embodiments described above, component mounting device 11 picks up specific component 50 and then images reference mark M on loading stand 28 before specific component 50 is temporarily loaded on loading stand 28, and corrects, based on pickup deviation amounts ΔXp1 and ΔYp1, target temporary loading position (Xt*, Yt*) determined based on the mark image. Further, component mounting device 11 temporarily loads specific component 50 and then images the upper surface of specific component 50 and reference mark M on loading stand 28, and acquires, based on the upper surface image, positional deviation amounts ΔXc and ΔYc of feature portion 51 with respect to the target temporary loading center of loading stand 28 which is determined based on the mark image. However, the present disclosure is not limited thereto, and component mounting device 11 may image reference mark M in advance and use the target temporary loading position (target temporary loading center) which is determined based on the mark image.

Further, in the embodiments described above, component mounting device 11 picks up again specific component 50 from loading stand 28 and then images the lower surface of specific component 50 by part camera 27, and corrects target mounting position (X*, Y*) based on re-pickup deviation amounts ΔXp2 and ΔYp2 which are acquired based on the lower surface image. However, component mounting device 11 may omit imaging of the lower surface of specific component 50 by part camera 27 after re-pickup. As described above, when specific component 50 is loaded on loading stand 28, a posture thereof is more likely to be stable than that when it is loaded on wafer pallet 15. Therefore, even if imaging of the lower surface of specific component 50 after re-pickup is omitted, it is possible to correctly mount specific component 50 on the target position of board S.

Figure 9:
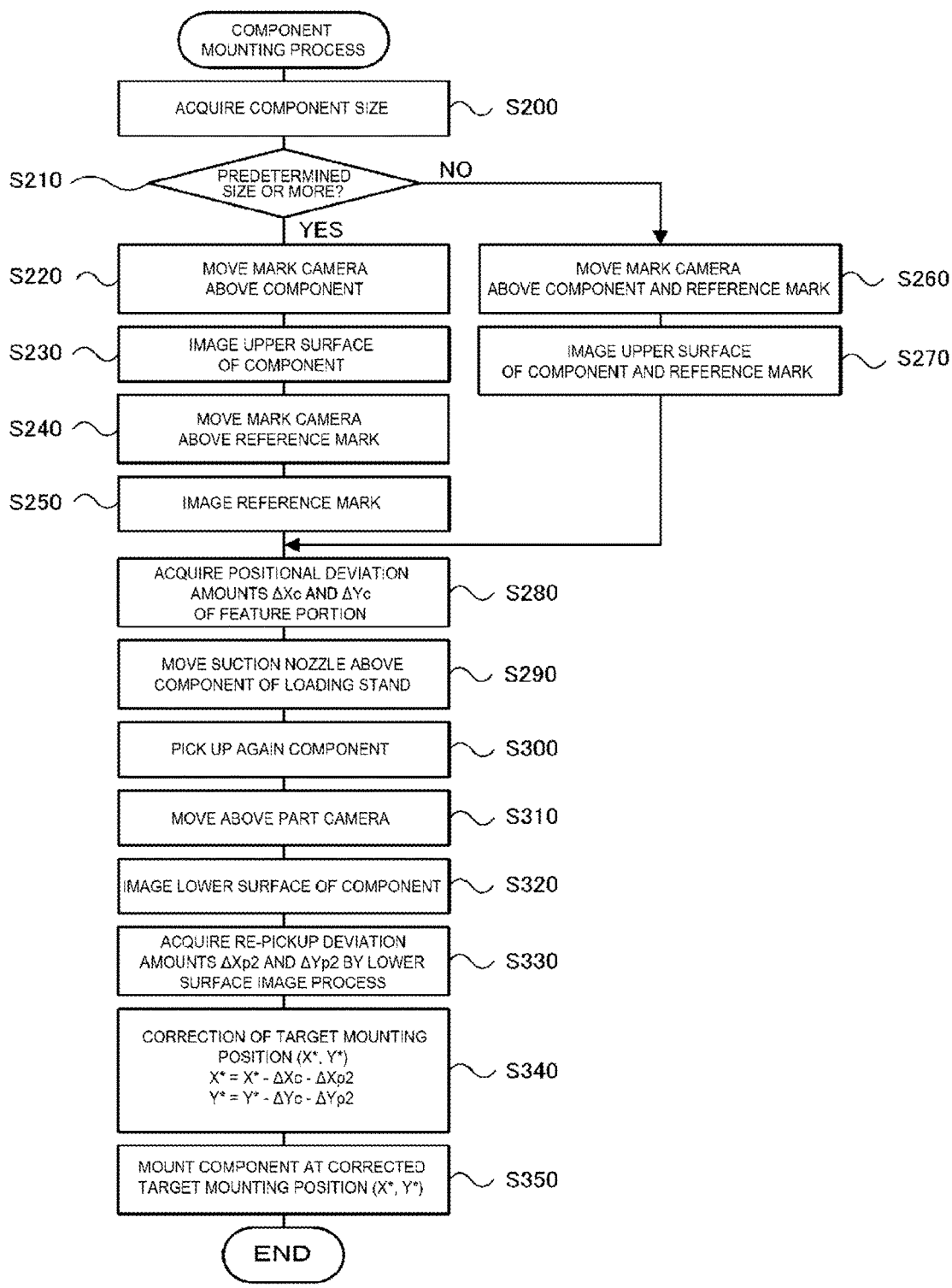
FIG. 9 is a flowchart illustrating a component mounting process of a modification example.

Further, in the embodiments described above, CPU 31 corrects target mounting position (X*, Y*) to board S in a direction in which the positional deviation is canceled based on positional deviation amounts ΔXc and ΔYc of feature portion 51 which is recognized by imaging the upper surface of specific component 50 which is temporarily loaded on loading stand 28. However, as illustrated in S280B and S290B of the component mounting process of FIG. 9, CPU 31 may offset (correct) pickup position (Xp, Yp) in a direction in which the positional deviation is canceled based on positional deviation amounts ΔXc and ΔYc of feature portion 51 to pick up again specific component 50 on loading stand 28. In this case, as illustrated in S340B, the correction of target mounting position (X*, Y*) is performed by offsetting in a direction in which the re-pickup deviation is canceled by re-pickup deviation amounts ΔXp2 and ΔYp2.

In the embodiments described above, component mounting device 11 includes head moving unit 23 that moves mounting head 24 in the XY direction. However, component mounting device 11 may include component supply unit 12, loading stand 28, and a moving unit for moving board S in the XY direction. That is, the moving unit may be one that relatively moves mounting head 24 with respect to component supply unit 12, loading stand 28, and board S.

INDUSTRIAL APPLICABILITY

The present disclosure can be applied to a manufacturing industry of a component mounting device.

REFERENCE SIGNS LIST 10 component mounting system, 11 component mounting device, 12 component supply unit, 13 feeder, 14 wafer supply unit, 15 wafer pallet, 16 sheet, 17 pot, 18 push-up pin, 21 board conveyance unit, 22 mounting unit, 23 head moving unit, 24 mounting head, 24a Z-axis motor, 25 suction nozzle, 26 mark camera, 27 part camera, 28 loading stand, 30 control device, 31 CPU, 32 ROM, 33 HDD, 34 RAM, 40 management computer, 42 input device, 44 display, 50 specific component, 51 feature portion, 51c center, 52 abutting surface, S board, W wafer.

The invention claimed is:

1. A component mounting device configured to mount a component, which has a feature portion on an upper surface, on a board, the component mounting device comprising:
   a head having a pickup member which picks up the component;
   a relative moving device configured to relatively move the head;
   an upper imaging device imaging the component from above;
   a lower imaging device imaging the component from below;

a temporary loading stand configured to temporarily load the component; and a control device configured to control the head and the relative moving device in such a way that a component supplied from a component supplying device is picked up, control the lower imaging device in such a way that a lower surface of the picked-up component is imaged, correct a target temporary loading position to the temporary loading stand based on a pickup deviation amount of the component that is recognized based on a lower surface image of the imaged component, control the head and the relative moving device in such a way that the picked-up component is temporarily loaded on the corrected target temporary loading position, control the upper imaging device in such a way that an upper surface of the temporarily loaded component is imaged, control the head and the relative moving device in such a way that the temporarily loaded component on the temporary loading stand is picked up again, control the lower imaging device in such a way that the lower surface of the re-picked up component is imaged, correct a target mounting position to the board based on a positional deviation amount of the feature portion recognized based on an upper surface image of the imaged component after being temporarily loaded, and a re-picked up deviation amount of the component that is recognized based on a lower surface image of the imaged component after being re-picked up, and control the head and the relative moving device in such a way that the re-picked up component is mounted at the corrected target mounting position.

2. The component mounting device according to claim 1, wherein the temporary loading stand has a mark imaged by the upper imaging device, wherein the correction of the target temporary loading position is performed by controlling the upper imaging device in such a way that the mark is imaged at a predetermined timing and correcting a target temporary loading position of the temporary loading stand, which is determined based on a mark image of the imaged mark, based on the pickup deviation amount of the component, and wherein the correction of the target mounting position is performed by controlling the upper imaging device in such a way that the upper surface of the component is imaged in a state where the component is temporarily loaded on the temporary loading stand, and based on a positional deviation amount of the feature portion recognized based on the upper surface image of the imaged component and a mark image of the mark, and a re-pickup deviation amount of the component that is recognized based on a lower surface image of the imaged component after being picked up again.

3. The component mounting device according to claim 2, wherein the predetermined timing is a timing after the component supplied by the component supplying device is picked up and before the picked-up component is temporarily loaded on the temporary loading stand.

4. The component mounting device according to claim 2, wherein the predetermined timing is a timing after the component is temporarily loaded on the temporary loading stand, and wherein the control device controls the upper imaging device in such a way that the upper surface of the component and the mark are simultaneously imaged in a state where the component is temporarily loaded on the temporary loading stand.

5. The component mounting device according to claim 4, wherein the control device acquires a size of a component to be mounted, controls the upper imaging device and the relative moving device in such a way that when the size of the acquired component is less than a predetermined size, the component and the mark are simultaneously imaged in a state where the component is temporarily loaded on the temporary loading stand, and controls the upper imaging device and the relative moving device in such a way that when the size of the acquired component is the predetermined size or more, the component and the mark are separately imaged in a state where the component is temporarily loaded on the temporary loading stand.

6. The component mounting device according to claim 1, wherein the temporary loading stand is installed at a position different from that of the lower imaging device.

7. A component mounting device configured to mount a component, which has a feature portion on an upper surface, on a board, the component mounting device comprising:

a head having a pickup member which picks up the component;

a relative moving device configured to relatively move the head;

an upper imaging device imaging the component from above;

a lower imaging device imaging the component from below;

a temporary loading stand configured to temporarily load the component; and a control device configured to control the head and the relative moving device in such a way that a component supplied from a component supplying device is picked up, control the lower imaging device in such a way that a lower surface of the picked-up component is imaged, correct a target temporary loading position to the temporary loading stand based on a pickup deviation amount of the component that is recognized based on a lower surface image of the imaged component, control the head and the relative moving device in such a way that the picked-up component is temporarily loaded on the corrected target temporary loading position, control the upper imaging device in such a way that an upper surface of the temporarily loaded component is imaged, control the head and the relative moving device in such a way that a pickup position is determined based on a positional deviation amount of the feature portion recognized based on an upper surface image of the imaged component to pick up again the component on the temporary loading stand, control the lower imaging device in such a way that the lower surface of the re-picked up component is imaged, correct a target mounting position to the board based on a re-pickup deviation amount of the component that is recognized based on a lower surface image of the imaged component after being picked up again, and control the head and the relative moving device in such a way that the re-picked up component is mounted at the corrected target mounting position.

* * * * *